United States Patent [19]

Zappala'

[11] 4,134,047
[45] Jan. 9, 1979

[54] CIRCUIT FOR GENERATING A SAW-TOOTH CURRENT IN A COIL

[75] Inventor: Giuseppe Zappala', Turin, Italy

[73] Assignee: Indesit Industria Elettrodomestici Italiana S.p.A., Rivalta (Turin), Italy

[21] Appl. No.: 804,662

[22] Filed: Jun. 8, 1977

[30] Foreign Application Priority Data

Jun. 15, 1976 [IT] Italy .................... 68468 A/76

[51] Int. Cl.$^2$ ............................ H01J 29/70
[52] U.S. Cl. ............................ 315/408
[58] Field of Search ..................... 315/408

[56] References Cited

U.S. PATENT DOCUMENTS

| | | | |
|---|---|---|---|
| 3,906,305 | 9/1975 | Nillesen | 315/408 X |
| 3,906,307 | 9/1975 | Hattum | 315/408 |
| 3,912,972 | 10/1975 | Otten et al. | 315/408 X |
| 3,950,674 | 4/1976 | Joosten et al. | 315/408 X |
| 4,024,434 | 5/1977 | Joosten et al. | 315/408 X |

FOREIGN PATENT DOCUMENTS

| | | | |
|---|---|---|---|
| 2130902 | 12/1971 | Fed. Rep. of Germany | 315/408 |
| 2426661 | 12/1974 | Fed. Rep. of Germany | 315/408 |
| 2553265 | 6/1976 | Fed. Rep. of Germany | 315/408 |

*Primary Examiner*—Malcolm F. Hubler
*Attorney, Agent, or Firm*—Sughrue, Rothwell, Mion, Zinn and Macpeak

[57] ABSTRACT

A circuit for generating a saw-tooth current waveform in a coil comprises a parallel resonant circuit, of which the coil in which the saw-tooth current is to be generated forms part. The parallel resonant circuit includes two capacitors in parallel and a first diode, in parallel with one of the capacitors, and in parallel with which is a switching transistor connected via a second diode to the cathode of the first diode. Input energy from a power source is fed to the junction between the second diode and the switching transistor via an inductance which forms a resonant circuit with a further capacitor forming at least part of a reactance in parallel with the second diode.

6 Claims, 2 Drawing Figures

CIRCUIT FOR GENERATING A SAW-TOOTH CURRENT IN A COIL

The present invention relates to a circuit for generating a saw-tooth current in a coil. For convenience of notation, the rising, ramp, portion of a saw-tooth waveform will hereinafter be referred to as the "trace" part of each saw-tooth and the descending return, portion of the saw-tooth waveform will be referred to as the "retrace" part of each saw-tooth.

Circuits formed as embodiments of the present invention may be used for a wide variety of application, but are particularly useful in a line deflection circuit of a television receiver, of a known type in which the coil forms part of a parallel resonant circuit which operates during the retrace of the saw-tooth and which further includes a first capacitor the voltage of which influences the trace part of the saw-tooth, a second capacitor for the retrace, and a first diode, wherein during the first part of the trace of each saw-tooth, current flows through the first diode, and during the second part of the trace of each saw-tooth, current flows in the opposite direction, through a controlled switching device which is connected in parallel with the first diode, which switching device is closed (made conducting) during a second part of each trace, is open during each retrace, and is connected, during the said second part of each trace in parallel with the first diode through a second diode, and wherein input energy from a voltage source is supplied to an inductance connected between the said source and the switching device and is transferred, during each retrace, to the parallel resonant circuit.

A known circuit of this type is described in German Pat. No. 2,130,902.

The present invention seeks to provide a circuit similar to this known circuit, but which is simpler and therefore less costly. Embodiments of the present invention have the advantage that the control of the magnitude of the saw-tooth current can be effected, not only in the same way as in the circuit illustrated in German Pat. No. 2,130,902, but also in other ways giving greater scope of the designer incorporating this circuit in electronic apparatus such as for example, a television receiver.

According to the present invention, there is provided a circuit for obtaining a saw-tooth current in a coil, suitable as a line deflection circuit for a television receiver, in which the coil forms part of a parallel resonant circuit which operates during the retrace of the saw-tooth and which further includes a first capacitor the voltage of which influences the trace part of the saw-tooth, a second capacitor for the retrace, and a first diode, wherein during the first part of the trace of each saw-tooth, current flows through the first diode, and during the second part of the trace, of each saw-tooth, current flows in the opposite direction, through a pulse controlled switching device which is connected in parallel with the first diode, which switching device is closed (made conducting) during a second part of each trace, is open during each retrace, and is connected, during the said second part of each trace in parallel with the first diode through a second diode, and wherein input energy from a voltage source is supplied to an inductance connected between the said source and the switching device and is transferred, during each retrace, to the parallel resonant circuit, the energy stored at the end of each trace in magnetic form in the inductance coil being transferred during each retrace to the parallel resonant circuit through a reactance including a capacitor which is so dimensioned that the resonant circuit formed by this capacitor and the said inductance connected between the input source and the switching device has a period which is of the order of the period of the saw-tooth.

One embodiment of the invention will now be more particularly described, by way of example, with reference to the accompanying drawings, in which.

Figure 1:
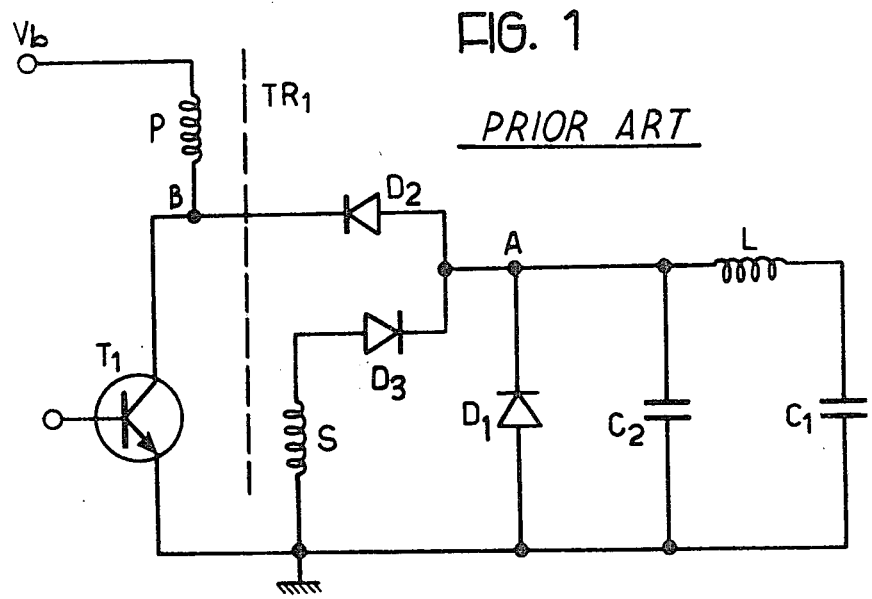
FIG. 1 is a circuit diagram of a prior art circuit for generating a saw-tooth current in a coil.

Referring first to the prior art shown in FIG. 1, the coil in which the saw-tooth current is to be generated is indicated L and this is connected to earth at each end by parallel capacitors $C_1$ and $C_2$ which, with the coil L form a parallel resonant circuit. In parallel with the capacitor $C_2$ in a first diode $D_1$ the cathode of which is connected to a circuit point A which is connected via a second diode $D_2$ and an inductance coil P to a voltage source $V_b$. The coil P is the primary winding of a transformer, generally indicated $TR_1$ the secondary S of which is connected between earth and the anode of a third diode $D_3$ the cathode of which is connected to circuit point A. Between the second diode $D_2$ and the primary P of the transformer $TR_1$, at a circuit point B, is connected the collector of a switching transistor $T_1$ the emitter of which is earthed.

In the prior art circuit shown in FIG. 1 the energy stored in magnetic form in the transformer $TR_1$ at the end of the trace part of the saw-tooth, at which point the transistor $T_1$ is rendered non-conducting, is transferred by the secondary winding S, during the retrace part of the saw-tooth, through the third diode $D_3$ to the parallel resonant circuit $C_1$, $C_2$, L. The transistor $T_1$ which is connected in series with the primary P of the transformer $TR_1$ remains off for a first part of each trace and is then rendered conductive for a second part of the trace during which it is connected in parallel to the first diode $D_1$ through a second semi-conductor diode $D_2$ connected to the common point (B) of the circuit. In this known circuit the magnitude of the saw-tooth current flowing in the coil (L) is controlled by varying the conduction time of the transistor switch T1 and, consequently, the energy stored in the transformer.

The present invention is based on the recognition of the fact that it is necessary to transfer energy from the input circuit to the resonant circuit in order to make up for losses, and that for this purpose it is sufficient to create a suitable path between the point B and the point A of FIG. 1, and that it is not necessary to use either a transformer secondary winding or a third diode, as is the case in the known circuit.

Figure 2:
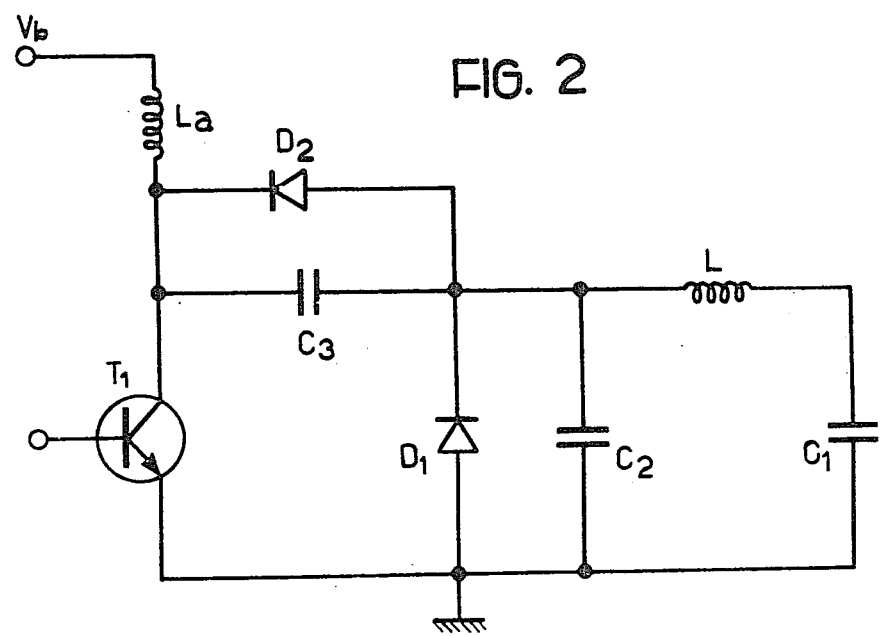
FIG. 2 is a circuit diagram of an embodiment of the present invention for obtaining a saw-tooth current in a coil.

FIG. 2 illustrates a circuit for obtaining a saw-tooth current, formed as an embodiment of this invention.

In place of the primary P of the transformer TR1 of FIG. 1 there is an inductance $La$; the secondary S of the transformer is omitted, as is also the third diode D3. Instead, connected in parallel to the diode $D_2$ there is a capacitor $C_3$ of appropriate value, that is to say proportional to the values of $La$, $C_2$, and the magnitude of the saw-tooth current required. As a first approximation it can be said that the resonance period of $La$ with $C_3$ is of the order of the required period of the saw-tooth.

The operation of the circuit of FIG. 2 is as follows. At the start of the ramp, the transistor $T_1$ is off and the current flows through the diode $D_1$. The waveform generated by the circuit extends on both sides of zero current, so that during the trace portion of the waveform the current starts flowing in one direction, falls to zero, changes polarity and then starts flowing in the opposite direction, following the trace portion, that is during the retrace portion, the current flowing in the said opposite direction falls to zero and then reverses back to the said one direction. During the trace portion and before the current changes direction, the transistor T1 is turned on, by means of a suitable control signal applied to its base; the current which flows in the collector circuit of transistor T1 also flows in the inductance La. At the moment when the deflection current changes direction the diode $D_1$ ceases conducting and the deflection current starts flowing in the diode $D_2$ and transistor T1. At the end of the trace portion the transistor T1 is cut off by the control signal and the energy stored up in the inductance La produces a current which flows through the capacitor $C_3$ to charge the retrace capacitor $C_2$ making up for the losses in the system.

The mean voltage on the trace capacitor $C_1$ is lower than that of the input Vb; the retrace voltage peak is about equal on the collector of T1 and on the capacitor $C_2$; it is thus possible to use an input voltage Vb greater than that which would be acceptable if the deflection coil L were directly connected to the collector of the transistor T1, rather than through the parallel connected capacitor $C_3$ and diode $D_2$.

The mean voltage on $C_1$ increases with an increase in the time of conduction of T1 (that is to say, with an increase in the duration of the conduction) because the energy stored in the inductance La is also thus increased; the value of this mean voltage also increases if the value of the inductance La is decreased (for the same reason). It is therefore possible to control the magnitude of the saw-tooth current by varying the conduction time of the transistor T1 or by varying the value of the inductance La, a very easy matter to achieve by using a saturable reactor. In principle, it would be also possible to control the energy transferred to the resonant circuit ($C_1$, $C_2$, L) by varying $C_3$ or, more practically, by placing in series with $C_3$ an additional inductance and causing its value to vary; alternatively, this series inductance could serve for limiting the discharge current peak of the capacitor $C_3$ at the moment when the transistor T1 becomes conducting.

It may be noted that in FIG. 4 of the above-mentioned German Pat. No. 2,130,902, there is a capacitor, shown in broken lines, in parallel with the diode D (which corresponds to the diode $D_2$ of FIG. 1 of the drawings accompanying the present Application). However in the text of the German Patent (column 6, lines 15-19) it is stated: "The capacitors indicated in broken lines in FIG. 4 are inserted to prevent undesirable parasitic oscillations and, in principle, do not take part in the required operation of the deflection circuit according to the invention."

It is therefore clear that the inventor of the circuit described in that patent was not aware that such a capacitor, suitably dimensioned could render superfluous the secondary of the transformer and the third diode.

What is claimed is:

1. In a circuit for obtaining a saw-tooth current in a coil, suitable as a line deflection circuit for a television receiver and comprising:
   said coil in which the saw-tooth current is to be generated, said coil having first and second terminals;
   a first capacitor having first and second terminals, said first terminal being connected to said first terminal of said coil;
   a first diode having first and second terminals, said first terminal being connected to said second terminal of said first capacitor and said second terminal being connected to said second terminal of said coil to form a loop, one of said first and second terminals of said first diode being connected to a reference potential;
   a second capacitor having first and second terminals and a capacity much lower than said first capacitor, said first terminal being connected to the common junction point of said first diode and said coil and said second terminal being connected to one of said first and second terminals of said first capacitor to form together with said coil and said first capacitor a resonant circuit such that the voltage on said first capacitor influences the trace part of said saw-tooth current in said coil and the voltage of said second capacitor influences the retrace part of said saw-tooth current in said coil;
   an inductance connected to a voltage source and a pulse controlled switching device connected between said inductance and said point of reference potential;
   a second diode connected between the terminal of said first diode not connected to said reference potential and the junction between said controlled switching device and said inductance, said controlled switching device being non-conducting during a first portion of said trace part of said saw-tooth current in said coil, being conducting during a second portion of said trace part of said saw-tooth current and being non-conducting during the retrace part of said saw-tooth current;
   input energy from said voltage source being supplied to said inductance connected between said source and said controlled switching device and being transferred, during each retrace part of said saw-tooth current, to said parallel resonant circuit;
   the improvement wherein there is further provided a reactance connected in parallel with said second diode, for transferring energy stored at the end of each trace part of said saw-tooth in magnetic form in said inductance to said parallel resonant circuit during said retrace part of said saw-tooth, said reactance including a capacitor the value of which is such that the resonant circuit formed by this capacitor and said inductance connected between the input source and said controlled switching device has a period which is of the same order as the period of the saw-tooth current generated in said coil, so that by varying the value of said capacitor it is possible to control the transferring of said stored energy.

2. A circuit as in claim 1, wherein said reactance is substantially constituted by said capacitor.

3. A circuit as in claim 1, wherein said reactance comprises said capacitor and a further inductance in series therewith.

4. A circuit as in claim 1, wherein said inductance connected between said input source and said controlled switching device is adjustable, whereby the amplitude of said saw-tooth current can be controlled by adjusting the value of this inductance.

5. A circuit as in claim 1, wherein the conduction time of said controlled switching device is adjustable whereby the amplitude of the saw-tooth current can be controlled by varying the conduction time of said controlled switching device.

6. A circuit as in claim 3, wherein said further inductance in series with said capacitor forming said reactance is adjustable whereby the amplitude of the saw-tooth current can be controlled by varying the value of this inductance.

* * * * *